United States Patent
Ostrom et al.

(10) Patent No.: US 6,781,531 B2
(45) Date of Patent: Aug. 24, 2004

(54) STATISTICALLY BASED CASCADED ANALOG-TO-DIGITAL CONVERTER CALIBRATION TECHNIQUE

(75) Inventors: Kenneth A. Ostrom, Palos Verdes Estates, CA (US); Laura L. Carpenter, Los Angeles, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/046,871

(22) Filed: Jan. 15, 2002

(65) Prior Publication Data

US 2003/0132867 A1 Jul. 17, 2003

(51) Int. Cl.[7] ............................. H03M 1/06; H03M 1/10
(52) U.S. Cl. ..................................... 341/120; 341/118
(58) Field of Search ............................. 341/118, 120, 341/161; 375/285; 702/89, 109; 368/202

(56) References Cited

U.S. PATENT DOCUMENTS

| | | | | |
|---|---|---|---|---|
| 4,187,466 A | * | 2/1980 | Kasson et al. | 375/285 |
| 4,352,160 A | * | 9/1982 | Frech et al. | 702/109 |
| 4,354,177 A | * | 10/1982 | Sloane | 341/120 |
| 4,399,426 A | | 8/1983 | Tan | |
| 4,419,656 A | * | 12/1983 | Sloane | 341/120 |
| 4,763,105 A | * | 8/1988 | Jenq | 341/120 |
| 4,947,168 A | | 8/1990 | Myers | |
| 4,982,350 A | * | 1/1991 | Perna et al. | 702/89 |
| 4,996,530 A | | 2/1991 | Hilton | |
| 5,294,926 A | * | 3/1994 | Corcoran | 341/120 |
| 5,465,092 A | * | 11/1995 | Mayes et al. | 341/118 |
| 5,499,027 A | * | 3/1996 | Karanicolas et al. | 341/120 |
| 5,926,123 A | * | 7/1999 | Ostrom et al. | 341/120 |
| 6,111,529 A | * | 8/2000 | Maulik et al. | 341/120 |

* cited by examiner

*Primary Examiner*—Patrick Wamsley
(74) *Attorney, Agent, or Firm*—Leonard A. Alkov

(57) ABSTRACT

An auto-calibration technique for optimizing the transfer function of analog-to-digital converters. The technique can be applied to analog-to-digital converter (ADC) architectures employing a cascade of n-stages to form a composite n-bit ADC transfer function. The technique utilizes evaluation of the probability density function of individual bits to determine error sign, minimize error magnitude and assure calibration convergence.

13 Claims, 5 Drawing Sheets

Fig. 9

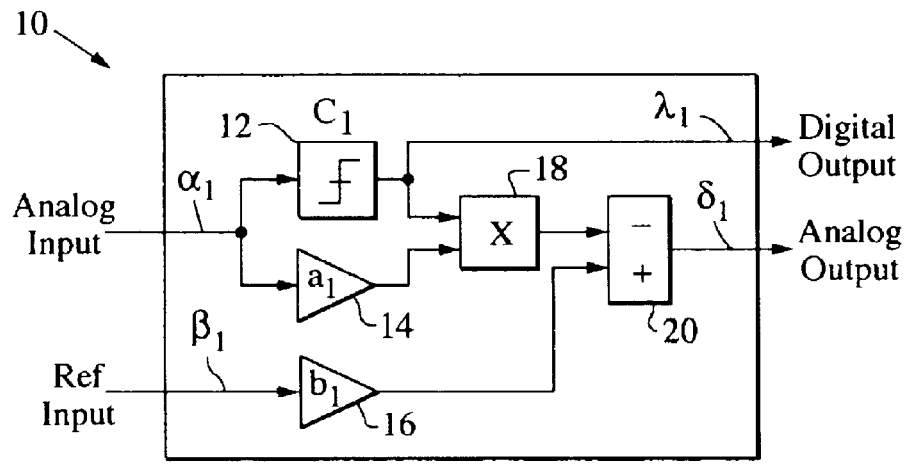
Fig. 1
(Prior Art)
Fig. 2
(Prior Art)
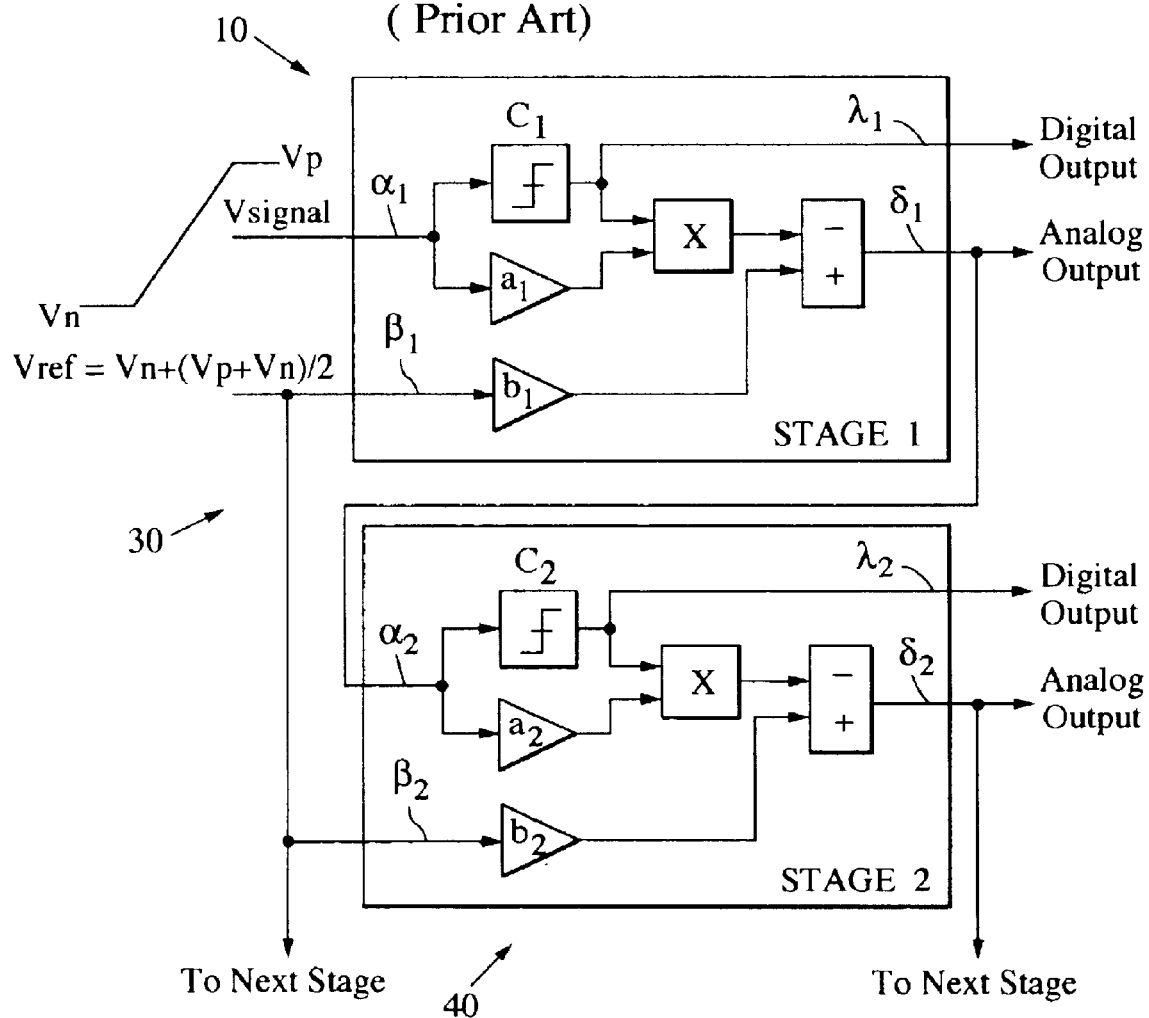

US 6,781,531 B2

STATISTICALLY BASED CASCADED ANALOG-TO-DIGITAL CONVERTER CALIBRATION TECHNIQUE

This invention was made with Government support under Contract No. N00019-98-C-0003 awarded by the Department of the Navy. The Government has certain rights in this invention.

BACKGROUND OF THE DISCLOSURE

This disclosure relates to analog-to-digital converters. Analog-to-digital converter (ADC) systems are employed to convert analog signal values into corresponding digital values.

This invention is an advance in the art of ADC systems.

SUMMARY OF THE DISCLOSURE

An aspect of the invention is an auto-calibration technique for optimizing the transfer function of analog-to-digital converters. The technique can be applied to analog-to-digital converter (ADC) architectures employing a cascade of n-stages to form a composite n-bit ADC transfer function. The technique utilizes evaluation of the probability density function of individual bits to determine error sign, minimize error magnitude and assure calibration convergence.

BRIEF DESCRIPTION OF THE DRAWING

These and other features and advantages of the present invention will become more apparent from the following detailed description of an exemplary embodiment thereof, as illustrated in the accompanying drawings, in which:

FIG. 1 is a schematic block diagram of a core stage for an N-bit ADC.

FIG. 2 is a schematic block diagram of a cascaded arrangement of N one-bit stages to form an N-bit ADC.

DETAILED DESCRIPTION OF THE DISCLOSURE

Figure 3A:
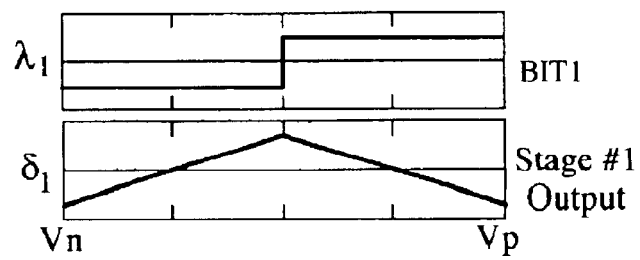
FIGS. 3A–3B illustrate typical output waveforms for the digital outputs and analog outputs of stages 1 and 2 of the ADC of FIG. 2.

A block diagram of a core stage 10 used to form a one-bit per stage N-bit analog-to-digital converter (ADC) is shown in FIG. 1. The core stage is known in the art, and includes a comparator 12, a signal amplifier 14, a reference amplifier 16, a multiplier 18 and a subtractor 20. The basic ADC operation is as follows. The analog input signal $\alpha_1$ is sampled by the comparator 12 and a single-bit digital output $\lambda_1$ is generated. The analog input signal is also amplified with gain $a_1$ by the signal amplifier 14 and multiplied with the comparator digital output. The result of this multiplication is subtracted via subtractor 20 from a reference signal $\beta_1$ which is amplified with gain $b_1$ by the reference amplifier 16. The resulting transfer function is described by:

Given:

$$\lambda_1 = 1 \text{ for } \alpha_1 > 0$$

$$\lambda_1 = -1 \text{ for } \alpha_1 < 0$$

$$\lambda_1 = 0 \text{ for } \alpha_1 = 0$$

The overall transfer function can be written:

$$\delta_1 = \beta_1 b_1 - \lambda_1 \alpha_1 a_1$$

A block diagram of an overall one-bit state per stage, N-bit analog-to-digital converter (ADC) 30, known in the art, is shown in FIG. 2. The operation of the first block or stage 10 is as described above with respect to FIG. 1. Additional stages including second stage 40 are cascaded to provide N one-bit stages, forming the N-bit ADC. The analog input voltage range corresponding to the full scale range of the ADC is bounded with a minimum of Vn and a maximum of Vp, and the nominal reference input is midway between Vn and Vp. The input reference signal is applied to all N stages, while the analog output of stage "n" is applied to the analog input of the stage "n+1" in a daisy chain fashion for all N stages.

Figure 3B:
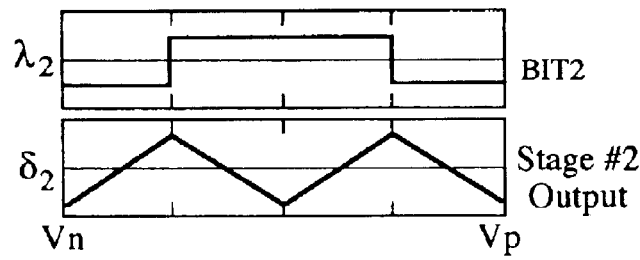

Typical output waveforms for the digital outputs and analog outputs of stages 1 and 2 are shown in FIGS. 3A–3B. The first stage (n) in the cascade of "N" stages produces a single zero crossing for an input signal swept over the ADC full scale voltage range producing the overall ADC most significant bit. The next stage (n+1) in the cascade of "N" stages produces two zero crossings for an input signal swept over the ADC full scale voltage range producing the overall ADC second most significant bit. The process continues until the final stage "N" produces $2^{(N-1)}$ zero crossings for an input signal swept over the ADC full scale voltage range producing the overall ADC least significant bit.

The ADC individual digital output bits have either of two states, i.e. "1" or "0". The probability density function of any of the digital output bits is defined as the number of occurrences of a given output state divided by the total number of states collected. For example, for a sample size of 1000 that results in a total of 500 state "1" and 500 state "0" the probability density function for both "1" and "0" is 0.5. For a sample size of 1000 that results in a total of 600 state "1" and 400 state "0" the probability density function of "1" is 0.6 and the probability density function of "0" is 0.4.

Figure 4A:
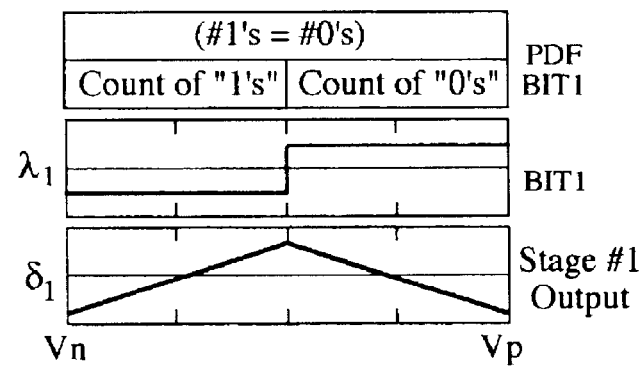
FIGS. 4A–4B illustrate typical output waveforms for the digital outputs and analog outputs for the upper two bits of an ideal N-bit ADC.
Figure 4B:
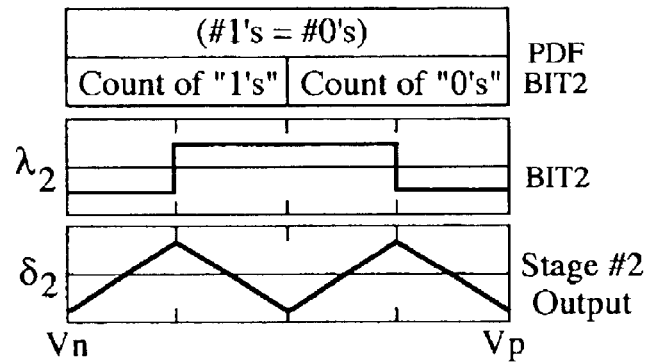

The calculation of bit probability density function as described above can be used in the context of calibration of an analog-to-digital converter. Consider the upper two bits of the N-bit ADC 30. The ADC is assumed to have no errors. The probability density function for the upper two bits (Bit #1 and Bit #2) is shown to be 0.5 (the total number of "1" states equals the total number of "0" states for a given sample set) in all cases given an input signal which is linearly swept from Vn to Vp. Typical output waveforms for the digital outputs and analog outputs of stages 1 and 2 of the ADC 30 are shown in FIGS. 4A–4B, for the probability density function just described.

Figure 5:
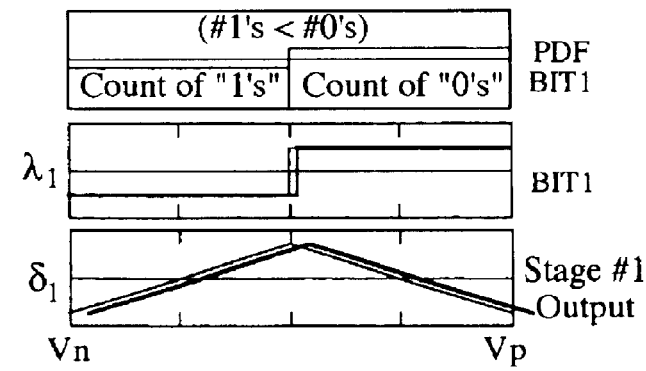
FIG. 5 illustrates ideal and error waveforms for the first stage output of an N-bit ADC, wherein the error waveform is for an offset error in the first stage comparator.

A simple error case where the comparator of the first stage (C1) has an offset error is illustrated in FIG. 5, which illustrates the output waveforms for the digital outputs and analog outputs of stage 1 of the ADC 30. The "ideal" ADC waveforms are shown as dashed lines while the "error" waveforms are shown with solid lines. The error causes a shift in the bit #1 and stage #1 output waveforms as illustrated in FIG. 5. Examination of the probability density function (PDF) for bit #1 results in a count of "0" states that exceeds the number of "1" states for this example. Given an initial offset error with opposite polarity, the count of "1"s would exceed the count of "0"s for this example. An offset correction signal can be applied at the analog input of stage #1 and the PDF of bit #1 reexamined until a PDF of equal "1" and "0" states is obtained thus correcting for the offset error by examining only the digital output of stage #1.

Figure 6A:
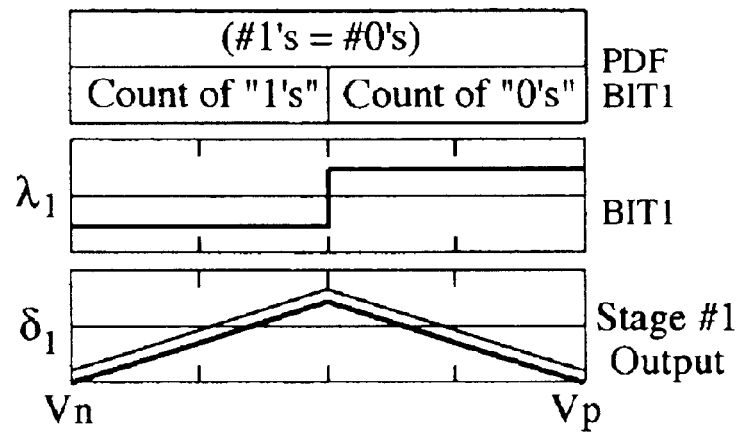
FIGS. 6A–6B illustrate an error case where there is either a gain or offset error in the stage #1 reference path, showing exemplary output waveforms for the digital outputs and analog outputs of stages 1 and 2 of the ADC.
Figure 6B:
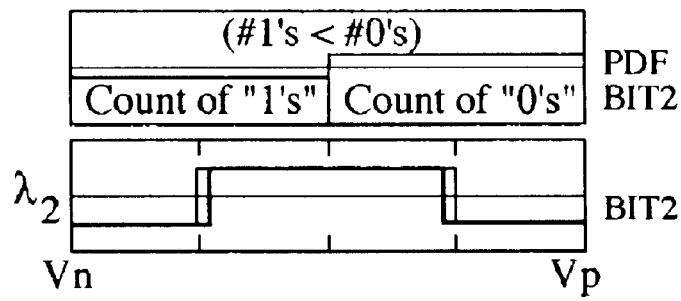

An error case where there is either a gain or offset error in the stage #1 reference path is illustrated in FIGS. 6A–6B, showing exemplary output waveforms for the digital outputs and analog outputs of stages 1 and 2 of the ADC 30. Again, the "ideal" ADC waveforms are shown as dashed lines while the "error" waveforms are shown with solid lines. The error causes a shift in the bit #2 and stage #1 output waveforms as illustrated without affecting the bit #1 output. Examination of the probability density function (PDF) for bit #2 results in a count of "0" states that exceeds the number of "1" states for this example. An offset correction signal can be applied to the reference input of stage #1 and the PDF of bit #2 reexamined until a PDF of equal "1" and "0" states is obtained thus correcting for the offset error by examining only the digital output of stage #2.

Figure 7A:
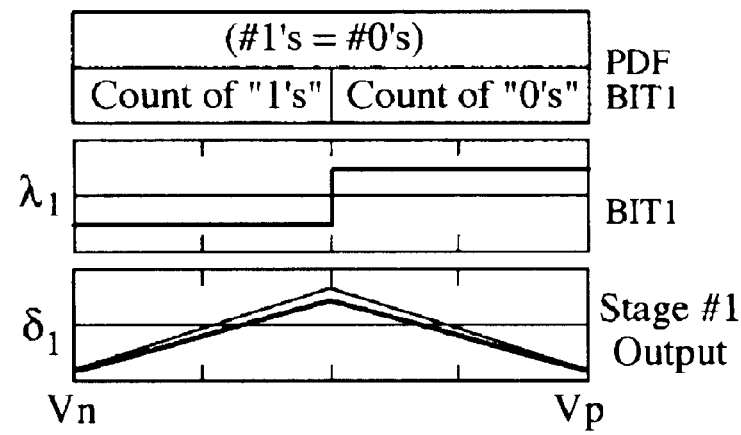
FIGS. 7A–7B illustrate an error case where there is a gain error in the stage #1 signal path, showing exemplary output waveforms for the digital outputs and analog outputs of stages 1 and 2 of the ADC.
Figure 7B:
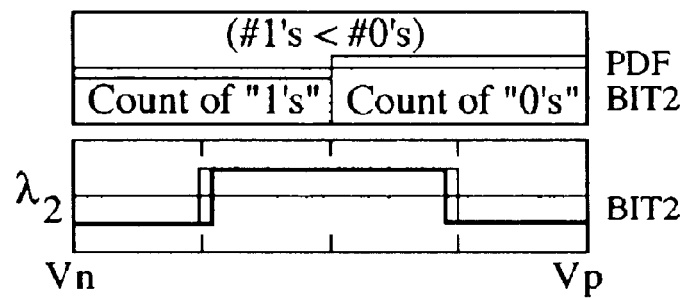

An error case where there is a gain error in the stage #1 signal path is illustrated in FIGS. 7A–7B, illustrating exemplary output waveforms for the digital outputs and analog outputs of stages 1 and 2 of the ADC 30. Again, the "ideal" ADC waveforms are shown as dashed lines while the "error" waveforms are shown with solid lines. The error causes a shift in the bit #2 and stage #1 output waveforms as illustrated without affecting the bit #1 output. Examination of the probability density function (PDF) for bit #2 results in a count of "0" states that exceeds the number of "1" states for this example. An offset correction signal can be applied to the reference input of stage #1 and the PDF of bit #2 reexamined until a PDF of equal "1" and "0" states is obtained thus correcting for the gain error by examining only the digital output of stage #2.

Figure 8A:
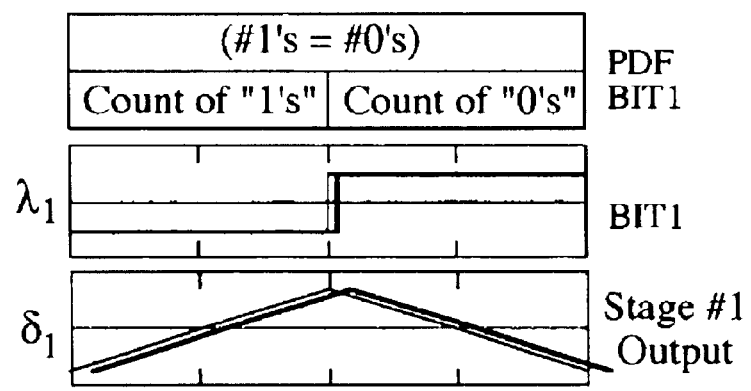
FIGS. 8A–8B illustrate an error case where there is an offset error in the stage #1 signal path of the ADC, showing exemplary output waveforms for the digital outputs and analog outputs of stages 1 and 2 of the ADC.
Figure 8B:
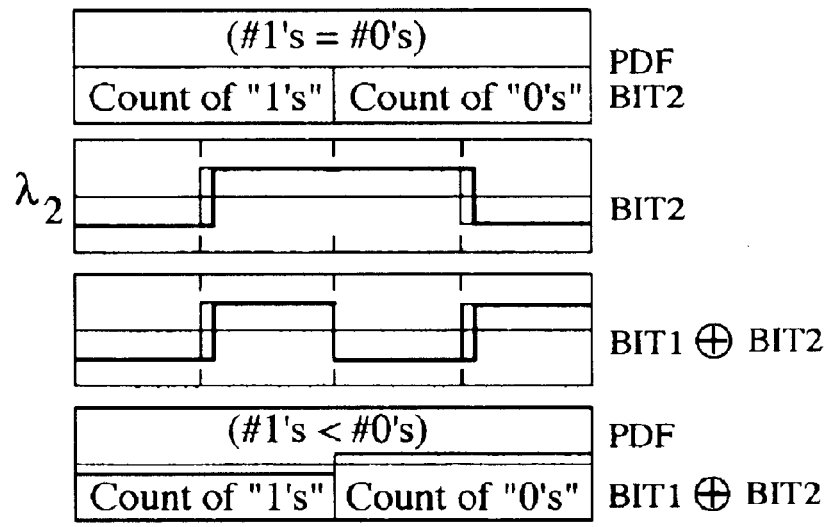

Finally, an error case where there is an offset error in the stage #1 signal path is illustrated in FIGS. 8A–8B, illustrating exemplary output waveforms for the digital outputs and analog outputs of stages 1 and 2 of the ADC 30. Again, the "ideal" ADC waveforms are shown as dashed lines while the "error" waveforms are shown with solid lines. The error causes a shift in the bit #2 and stage #1 output waveforms as illustrated without affecting the bit #1 output. Examination of the probability density function (PDF) for bit #2 results in an equal count of "0" and "1" states for this example despite the presence of an error. However, the PDF of the exclusive-or of bit #1 and bit #2 results in a count of "0" states that exceeds the number of "1" states for this example. An offset correction signal can be applied to the signal input of stage #2 and the PDF of the exclusive-or of bit #1 and bit #2 reexamined until a PDF of equal "1" and "0" states is obtained thus correcting for the offset error by examining the exclusive-or of the digital outputs of stage #2 and stage #1.

Figure 9:
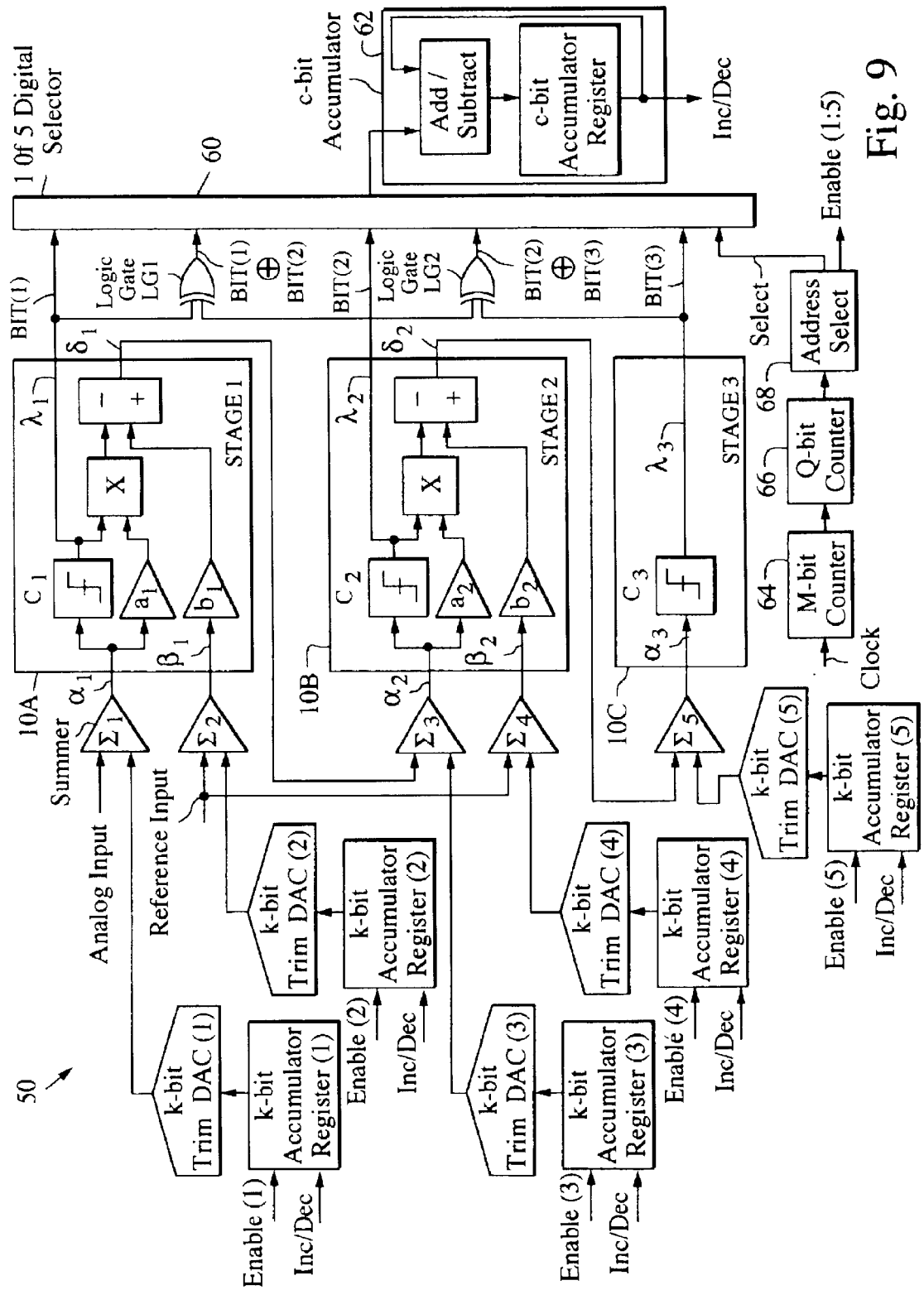
FIG. 9 is a block diagram of an exemplary hardware implementation of an ADC embodying an aspect of the invention.

A block diagram of an exemplary hardware implementation of an N-bit ADC 50 embodying aspects of the invention is shown in FIG. 9. The example embodiment illustrates the invention in the context of a 3-bit ADC 50, although the invention is applicable to any ADC architecture having a cascade of N-stages, wherein the first stage determines the most significant or coarse bit(s), the last stage determines the least significant or finest resolution bit(s), and the stages in between (if any) determine the intermediate bit(s).

The example embodiment of FIG. 9 includes a multi-state analog-to-digital converter comprising Stage 1 (10A), Stage 2 (10B) and Stage 3 (10C), with each stage having an analog input signal ($\alpha$), a reference input signal ($\beta$), an analog output signal ($\delta$), and a digital output bit ($\lambda$). Thus, Stage 1 has analog input signal $\alpha_1$, reference input signal $\beta_1$ an analog output signal $\delta_1$, and a digital output bit $\lambda_1$. Stage 2 has analog input signal $\alpha_2$, reference input signal $\beta_2$ an analog output signal $\delta_2$, and a digital output bit $\lambda_2$. Stage 3 can be simplified relative to Stages 1 and 2, since Stage 3 is the last stage in the ADC conversion chain. Stage 3 does not need to generate an analog output (difference) signal ($\delta$) since there is no Stage 4 to receive the signal in this exemplary embodiment.

Operation of the core stages 10A, 10B is as described above regarding stage 10 of FIG. 1. In addition, the exemplary embodiment of FIG. 9 includes two summers per Stage 1 and Stage 2, with the last Stage 3 having one summer. The first summer ($\Sigma_1$) generates an output signal which drives the analog input of Stage 1 consisting of the sum of the overall ADC analog input signal with a correction signal from k-bit trim DAC(1). The second summer ($\Sigma_2$) generates an output signal which drives the reference input of Stage 1 consisting of the sum of the overall ADC reference input signal with a correction signal from k-bit trim DAC(2).

The third summer ($\Sigma_3$) generates an output signal which drives the analog input of Stage 2 consisting of the sum of the analog output of Stage 1 with a correction signal from k-bit trim DAC(3). The fourth summer ($\Sigma_4$) generates an output signal which drives the reference input of Stage 2 consisting of the sum of the overall ADC reference input signal with a correction signal from k-bit trim DAC(4).

The fifth summer ($\Sigma_5$) generates an output signal which drives the analog input of Stage 3 consisting of the sum of the analog output of Stage 2 with a correction from k-bit trim DAC(5).

The exemplary embodiment 50 includes the five k-bit Trim Digital-to-Analog Converters (DACs), each trim DAC having an associated k-bit accumulator register having a unique enable signal (Enable(1), . . . Enable(5)) and a common increment/decrement input signal (Inc/Dec). The exemplary embodiment also includes a logic gate LG1 which creates an exclusive-or of BIT(1) ($\lambda_1$) and BIT(2) ($\lambda_2$), a logic gate LG2 which creates an exclusive-or of BIT(2) and BIT(3) ($\lambda_3$), a one of five digital selector 60 having five inputs consisting of BIT(1), logic gate LG1 output, BIT(2) logic gate LG2 output and BIT(3), one of which is passed to the output based upon a select control signal.

The exemplary embodiment of FIG. 9 also includes a c-bit accumulator 62 whose input is taken from the one-of-five digital selector 60 and whose output is the Inc/Dec signal common to all k-bit accumulator registers, an M-bit counter 64, a Q-bit counter 66 and an address select block 68.

The operation of the exemplary embodiment of the exemplary ADC 50 of FIG. 9 is as follows. The M-bit and Q-bit counters 64, 66 and c-bit accumulator 62 are reset to zero, the k-bit accumulator registers one through five are reset to mid-scale, the address select block 68 is set such that the one of five digital selector 60 passes BIT(1) to the c-bit accumulator input. A signal having either symmetric or uniform probability density properties is applied to the analog input of the overall ADC that then encodes the signal to a 3-bit digital resolution. The c-bit digital accumulator 62 is then decremented or incremented by "one" based upon the state of BIT(1). The c-bit digital accumulator functions such that its output is the summation or accumulation of all prior BIT(1) samples since being reset or zeroed.

The process of incrementing or decrementing based on BIT(1) continues until the M-bit counter 64 reaches terminal count which corresponds to $2^M-1$ ADC samples. At that time the Q-bit counter 66 is incremented by "one", the k-bit Accumulator Register(1) is enabled, and the output of the c-bit accumulator is examined, and if found to have a net positive change in value (Most Significant Bit (MSB)=1) then the k-bit Accumulator Register (1) is incremented by "one" thereby incrementing the associated k-bit Trim DAC (1) and increasing the signal presented to summer ($\Sigma_1$) Similarly, if the c-bit accumulator 62 is found to have a net negative change in value (MSB=0) then the k-bit Accumulator Register (1) is decremented by "one" thereby decrementing the associated k-bit Trim DAC(1) and decreasing the signal presented to summer ($\Sigma_1$). The value of M is chosen such that the c-bit accumulator output is a good statistical average of BIT(1). The M-bit counter is then reset to zero, and the basic loop continues until the Q-bit counter 66 reached terminal count. The value of Q is chosen to assure convergence of the overall calibration loop such that the optimal value of the k-bit Trim DAC has been determined. The M-bit and Q-bit counters and c-bit accumulator are reset to zero; the address block is set such that the one of five digital selector passes the output of BIT(2) to the c-bit accumulator input. The process continues as described above, with the output of the c-bit accumulator used to increment or decrement Trim DAC(2) at the appropriate time, until the Q-bit counter 66 reaches terminal count.

The M-bit and Q-bit counters 64, 66 and the c-bit accumulator 68 are reset to zero; the address select block 68 is set such that the one of five digital selector 60 passes the output of BIT(2) to the c-bit accumulator input. The process continues as described above, with the output of the c-bit accumulator used to increment or decrement Trim DAC(2) at the appropriate time, until the Q-bit Counter reaches terminal count.

The M-bit and Q-bit counters 64, 66 and the c-bit accumulator 62 are reset to zero; the address select block 68 is set such that the one of five digital selector passes logic gate LG1 output to the c-bit accumulator 60. The process continues as described above, with the output of the c-bit accumulator used to increment or decrement Trim DAC(3) at the appropriate time, until the Q-bit Counter reaches terminal count.

The M-bit and Q-bit counters 64, 66 and the c-bit accumulator 62 are reset to zero; the address select block is set such that the one of five digital selector passes BIT(3) to the c-bit accumulator. The process continues as described above, with the output of the c-bit accumulator used to increment or decrement Trim DAC(4) at the appropriate time, until the Q-bit counter 66 reaches terminal count.

Finally, the M-bit and Q-bit counters 64, 66 and the c-bit accumulator 62 are reset to zero; the address select block 68 is set such that the one of five digital selector 60 passes the output of logic gate LG2 to the c-bit accumulator. The process continues as described above, with the output of the c-bit accumulator 62 used to increment or decrement trim DAC(5) at the appropriate time, until the Q-bit counter reaches terminal count thereby completing one overall ADC calibration cycle. The calibration cycle can be repeated as necessary based upon changes to the ADC transfer function related to temperature, aging or other factors.

The ADC calibration algorithm thus employs a calibration signal having symmetric or uniform probability density be applied to the ADC input. The statistics of the bit transitions at each stage are examined individually starting with the most significant bit of the ADC transfer function, and working down to the least significant bit. The bit transition probability density functions are computed for both individual bits and for logical combinations of the bits in such a way as to determine deviation from the desired "ideal" transfer function related to both gain and offset errors within and between the stages. The deviations are then minimized through the use of trim digital-to-analog converters.

Other methods of updating the selected trim DAC based on the final output of the c-bit accumulator could be employed, and include, for example, 1) updating one trim DAC bit per accumulation based upon the sign of the accumulator beginning with the MSB, thereby converging on the DAC LSB in k steps, 2) updating all bits of the DAC simultaneously based on the final numeric value of the accumulation, thereby converging on the DAC LSB in one step or, or 3) updating p-bits of the DAC per accumulation where 1<p<k based on the final value of the accumulation, thereby converging on the DAC LSB in k/p steps.

The invention is applicable to a broad classification of analog-to-digital converter architectures. In an exemplary embodiment, the transfer function of an Analog-to Digital Converter (ADC) otherwise compromised by errors can be optimized for the purpose of achieving minimal deviation from ideal transfer function characteristics.

The self calibration circuitry eliminates the need for adjustment either by laser trimming of a resistor or other method during manufacture of the ADC thereby minimizing production cost. The self calibration circuitry compensates for errors related to temperature, aging and other environmental factors, which can not be achieved using traditional laser, trim techniques. The majority of the auto calibration circuitry is digital and adds minimal analog complexity to the ADC function. Moreover, in some applications, the auto calibration circuitry can be monolithically integrated with the ADC circuit function thereby requiring no off chip components.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A calibration method for optimizing the transfer function of analog-to-digital converter (ADC) employing a cascade of n stages to form a composite n-bit ADC transfer function, the ADC having an analog input and an n-bit digital output, each stage having an analog input, the method comprising:

applying a signal having a symmetric or uniform probability density property to the ADC analog input;

determining at least one error value for each stage resulting from application of said signal;

using the at least one error value for each stage to compensate each of said n stages during ADC operation.

2. The method of claim 1, wherein the n stages include a first stage which determines the treat significant or coarse bit(s), a last stage which determines the least significant or finest resolution bit(s), and wherein any intermediate stages in between the first stage and the last stage, if any, determine the intermediate bit(s).

3. The method of claim 2, wherein the step at determining at least one error value for each stag. includes:

examining statistics of bit transitions at each stage individually as a result of application of said signal.

4. The method of claim 3, wherein said examining statistics of bit transitions includes:

computing bit transition probability density functions for each stage output.

5. The method of claim 4, wherein said examining statistics of bit transitions includes:

computing the bit transition probability density functions for individual bits of each stage output and for logical combinations of said individual bits of each stage output to determine deviation from a desired ideal transfer function related to both gain and offset errors within and between the stages.

6. The method of claim 5, wherein said determining at least one error value for each stage includes using said deviation to determine said at least one error value.

7. The method of claim 1, wherein said step of using said at least one error values includes, for each stage:
   summing one of said at least one error values with said analog input to provide an error-compensated analog input to the stage.

8. The method of claim 1, wherein at least one of said n stages further has a reference analog input, and wherein said step of using said at least one error value for said at least one of said n stages includes:
   summing one of said at least one error with said reference analog input to provide an error-compensated reference analog input.

9. An analog-to-digital converter (ADC), comprising:
   a cascade of N-stages, wherein a first stage determines the most significant or coarse bit(s) for the ADC, and a last stage determines the least significant or finest resolution bit(s) for the ADC, the cascade of N-stages forming a composite n-bit ADC transfer function;
   an ADC analog input port;
   an ADC digital output port;
   the first stage having a stage analog input connected to the ADC analog input port, and producing a first stage digital output end a first stage digital output;
   a calibration circuit for optimizing the ADC transfer function in response to application to the ADC of a calibration signal having a symmetric or uniform probability density property to the ADC analog input, the calibration circuit for determining at least one error value for each stage resulting from application of said signal;
   an error compensation circuit coupled to the calibration circuit for compensating each stage in response to said at least one error value for each stage.

10. The ADC of claim 9, wherein each stage includes a summer circuit for summing the stage analog input with an analog error value for the stage.

11. The ADC of claim 10, wherein at least one of the N-stages has a stage analog reference signal, and each stage further includes a reference summer circuit for summing the stage analog reference signal with an analog reference error signal.

12. The ADC of claim 9, wherein the calibration circuit is adapted to determine a bit transition probability density function for each of said stage digital outputs and for logical combinations of said digital outputs to determine deviation from a desired ideal transfer function related to both gain and offset errors within and between the stages.

13. A calibration method for optimizing the transfer function of analog-to-digital converter (ADC) employing a cascade of n stages to form a composite n-bit. ADC transfer function, the n stages including a first stage which determines the most significant or coarse bit(s), and a last stage which determines the least significant or finest resolution bit(s), the ADC having an analog input and an n-bit digital output, each stage having an analog input, the method comprising:
   applying a signal having a symmetric or uniform probability density property to the ADC analog input;
   determining at least one error value for each stage resulting from application of said signal, by examining statistics of bit transitions at each stage to compute bit transition probability density functions for both individual stage outputs and for logical combinations of the stage outputs to determine deviation from a desired transfer function related to both gain and offset errors within and between the stages;
   using the at least one error value for each stage to compensate each of said n stages during ADC operation.

* * * * *